United States Patent [19]
Nagano

[11] Patent Number: 6,049,118
[45] Date of Patent: Apr. 11, 2000

[54] CIRCUIT BUILT-IN LIGHT-RECEIVING ELEMENT

[75] Inventor: Hiroki Nagano, Tokyo, Japan

[73] Assignee: NEC Corporation, Tokyo, Japan

[21] Appl. No.: 08/896,195

[22] Filed: Jul. 17, 1997

[30] Foreign Application Priority Data

Jul. 19, 1996 [JP] Japan .................................. 8-190435

[51] Int. Cl.[7] ........................... H01L 31/06; H01L 31/00; H01L 29/84
[52] U.S. Cl. .......................... 257/462; 257/461; 257/431; 257/432; 257/414; 257/440; 257/79; 257/80; 257/82; 257/83; 257/84; 257/187; 257/555
[58] Field of Search ................................... 257/461, 462, 257/431, 432, 414, 79, 80, 82, 83, 84, 440, 187, 555

[56] References Cited

FOREIGN PATENT DOCUMENTS

| | | | |
|---|---|---|---|
| 63-124458 | 5/1988 | Japan ..................... | 257/461 |
| 1-69059 | 3/1989 | Japan ..................... | 257/461 |
| 2-271667 | 11/1990 | Japan . | |
| 3-6056 | 1/1991 | Japan ........................... | H01L 27/14 |
| 7-93771 | 4/1995 | Japan . | |
| 7-183563 | 7/1995 | Japan ........................... | H01L 31/10 |
| 9-321265 | 12/1997 | Japan ........................... | H01L 27/14 |

OTHER PUBLICATIONS

"Preamplifier IC with Photodetectors for Optical Pickup" The Institute of electronics and Communication Engineers, Communication Technical Report, pp. 75–81, Nov. 1986.

English language translation of Japanese Office Action dated Apr. 13, 1999 (Hei 11).

*Primary Examiner*—Mahshid Saadat
*Assistant Examiner*—Matthew Warren
*Attorney, Agent, or Firm*—Whitham, Curtis & Whitham

[57] ABSTRACT

A circuit built-in light-receiving element includes a buried diffusion layer of the second conductivity type, a buried diffusion layer of the first conductivity type, an epitaxial layer of the second conductivity type, a diffusion layer of the first conductivity type, and a signal processing circuit element. The buried diffusion layer of the second conductivity type is formed in a first region on a substrate of the first conductivity type. The buried diffusion layer of the first conductivity type is selectively formed in the buried diffusion layer of the second conductivity type. The epitaxial layer of the second conductivity type is formed on the buried diffusion layer of the first conductivity type. The buried diffusion layer of the first conductivity type and the epitaxial layer of the second conductivity type constitute a light-receiving element. The diffusion layer of the first conductivity type reaches the buried diffusion layer of the first conductivity type through the epitaxial layer of the second conductivity type. The signal processing circuit element is formed in a second region on the substrate of the first conductivity type.

14 Claims, 9 Drawing Sheets

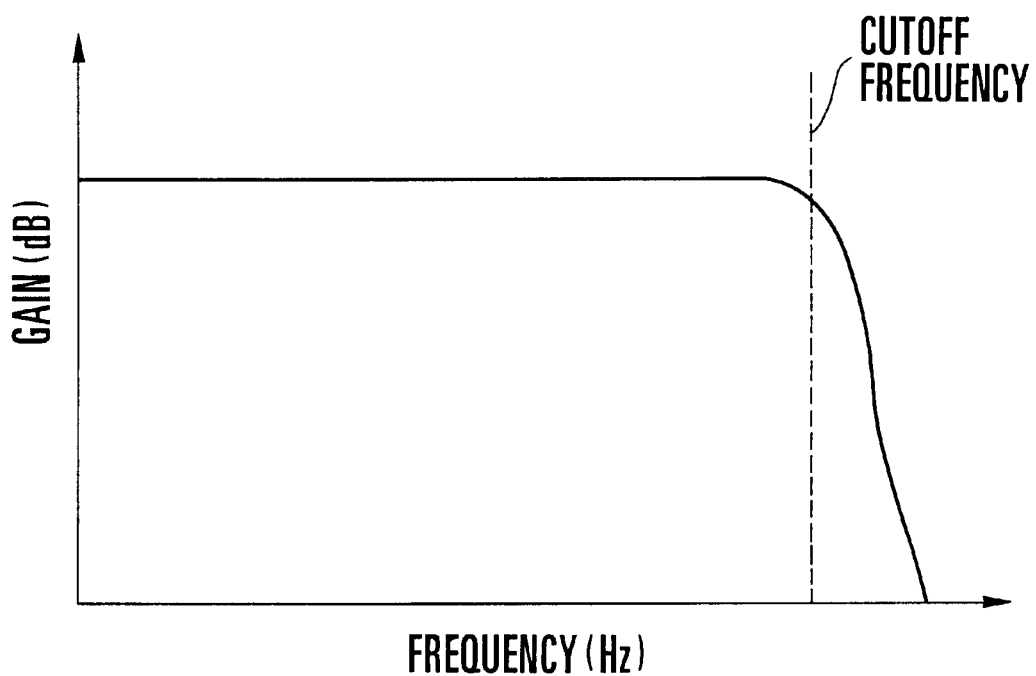
F I G. 2

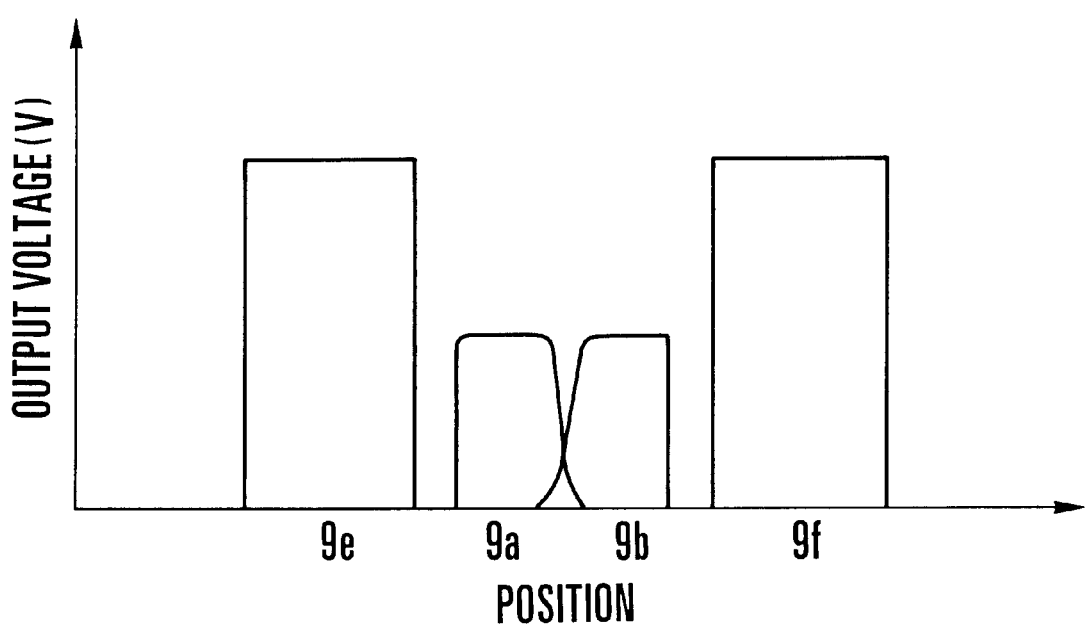
F I G. 4

CIRCUIT BUILT-IN LIGHT-RECEIVING ELEMENT

BACKGROUND OF THE INVENTION

The present invention relates to a signal processing circuit built-in light-receiving element.

Circuit built-in light-receiving elements each incorporating a signal processing circuit and a light-receiving element in a single chip have been widely used for a photodetector, a photocoupler, and the like.

FIG. 5 shows the basic arrangement of an optical disk apparatus using a circuit built-in light-receiving element. Referring to FIG. 5, in an optical pickup 51, a laser beam emitted from a semiconductor laser 52 is focused on an optical disk 70 through a grating plate 53, a half prism 54, a collimator lens 55, and an objective lens 56. The reflected beam from the optical disk 70 passes through the objective lens 56 and the collimator lens 55, and is reflected by the half prism 54 to be incident on a photodetector 58 constituted by the circuit built-in light-receiving element through a cylindrical lens 57.

As shown in FIG. 6, the photodetector 58 comprises four photodiodes 9a to 9d arranged in a 2×2 array, and two diodes 9e and 9f arranged on the two sides of the photodiodes 9a to 9d in order to perform focus servo control of driving the objective lens 56 in a direction vertical to the disk, and tracking servo control of driving the objective lens in the radial direction of the disk. This optical apparatus is disclosed in, e.g., Japanese Patent Laid-Open No. 7-93771.

FIG. 7 shows the circuit configuration of the photodetector 58. In FIG. 7, the photodiodes 9a to 9f are respectively connected to the inverting terminals of current-voltage conversion amplifiers 10a to 10f, and also connected to output terminals Voa to Vof via feedback resistors 11a to 11f. A reference voltage Vc is applied from a reference power supply (not shown) to the non-inverting terminals of the amplifiers 10a to 10f. Since the amplifiers 10a to 10f have large gains, the potentials of the inverting terminals (cathode potentials of the photodiodes 9a to 9f) are also equal to Vc. The voltage Vc is generally ½ a power supply voltage Vcc.

Assume that the resistance values of the resistors 11a to 11f are represented by R. When photocurrents I generated in the photodiodes 9a to 9f flow through the amplifiers 10a to 10f, an output voltage I×R+Vc is generated at the output terminals Voa to Vof of the amplifiers 10a to 10f. The frequency characteristics of the output voltage generated when an AC optical signal is input are determined by the characteristics of the amplifiers 10a to 10f.

FIG. 8 shows a conventional circuit built-in light-receiving element constituting the photodetector 58. In FIG. 8, a photodiode serving as a light-receiving portion, and an npn transistor constituting a signal processing circuit portion (the current-voltage conversion amplifiers 10a to 10f in FIG. 7) are formed on a p⁻-type substrate 21. Note that the photodiodes and the current-voltage conversion amplifiers are connected as shown in FIG. 7.

A method of manufacturing the circuit built-in light-receiving element having this arrangement will be described below. An n⁺-type buried diffusion layer 22 is formed in a prospective npn transistor formation region on the p⁻-type substrate 21. An n⁻-type epitaxial layer 24 is formed on the entire surface of the p⁻-type substrate 21 including the n⁺-type buried diffusion layer 22.

A p⁺-type diffusion layer 25 for separating respective elements is formed at the boundaries between the respective elements so as to extend through the epitaxial layer 24. An n⁺-type diffusion layer 26 for the collector of the npn transistor is formed to reach the n⁺-type buried diffusion layer 22 through the n⁻-type epitaxial layer 24. In the region of the signal processing circuit portion, a p⁺-type diffusion layer 27 serving as the base of the transistor is formed in the n⁻-type epitaxial layer 24. An n⁺-type diffusion layer 28b serving as the emitter is formed in part of the p⁺-type diffusion layer 27. At the same time, an n⁺-type diffusion layer 28a for the cathode of the photodiode is formed in part of the region of a light-receiving portion on the n⁻-type epitaxial layer 24.

The reference potential Vc is applied to the n⁻-type epitaxial layer 24 of the light-receiving portion through the n⁺-type diffusion layer 28a, while a GND potential is applied to the p⁻-type substrate 21. In this manner, a photodiode having the p⁻-type substrate 21 as the anode, and the n⁻-type epitaxial layer 24 as the cathode is formed.

At the light-receiving portion, a beam incident downward on the chip reaches the p⁻-type substrate 21 through the n⁻-type epitaxial layer 24. Light generation carriers generated in the depletion layer of this photodiode are accelerated by the electric field inside the depletion layer, and contribute to a high-speed photocurrent. However, carriers generated deep (outside the depletion layer) in the p⁻-type substrate 21 gradually spread by diffusion, and some reach an upper photodiode, while others reach an adjacent photodiode.

This diffusion current decreases the light reception response time, and also becomes a crosstalk current. At present, the thickness of the n⁻-type epitaxial layer 24 by a general circuit process is about 3 $\mu$m. Since the concentration of the p⁻-type substrate 21 is about $10^{15}$ cm$^{-3}$, the depletion layer widens to only about 3 to 4 $\mu$m. The absorption length of a 780-nm wavelength beam serving as a CD (Compact Disk) light source to Si is 10 $\mu$m. Therefore, it is found that a large amount of diffusion current is undesirably generated.

FIG. 9 shows the frequency characteristics of the circuit built-in light-receiving element in FIG. 8. The frequency characteristics show the gain of the output voltage (output from the current-voltage conversion amplifier) for the frequency of an input beam. It is found that the response of the photodiode delays due to the influence of the above-described diffusion current even in a range wherein the frequency is equal to or lower than the cutoff frequency of the signal processing circuit (current-voltage conversion amplifier), and that the gain gradually decreases.

In recent years, as the rotation speed and density of an optical disk increase for an increase in data transfer rate, a higher frequency band is required for a photodetector. In the characteristics shown in FIG. 9, the gain changes depending on the signal frequency. When such a photodetector is used in the optical pickup of the optical disk apparatus, the response changes depending on a high or low speed of a reflected beam from the disk, resulting in poor jitter characteristics.

FIG. 10 shows the photosensitivity map of the circuit built-in light-receiving element in FIG. 8. This photosensitivity map shows the value of the output voltage (output from the current-voltage conversion amplifier connected to each photodiode) when a beam is scanned along the line X–X' in FIG. 6. CT represents a voltage by a light-receiving current generated by a beam incident on an adjacent photodiode. It is found that crosstalk occurs between photodiodes.

Servo control of the optical disk apparatus is performed on the basis of difference signals from a plurality of photodiodes, e.g., two difference voltage signals Voa+Voc−Vob−Vod and Voe−Vof in FIG. 7. When crosstalk occurs between photodiodes, an error occurs in a disk alignment servo signal, and normal focus servo control and normal tracking servo control fail.

Japanese Patent Laid-Open No. 2-271667 discloses a circuit built-in light-receiving element like the one-shown in FIG. 11. In fabricating this circuit built-in light-receiving element, an n$^+$-type buried diffusion layer 32 is formed in a prospective photodiode region on a p-type substrate 31, and a p-type buried diffusion layer 33 is formed in a prospective npn transistor region on the p-type substrate 31. An n$^-$-type epitaxial layer 34 is grown thick in the npn transistor region on the p-type substrate 31. An n$^+$-type buried diffusion layer 35 is formed in part of the p-type buried diffusion layer 33.

An n-type epitaxial layer 36 is grown on the entire surfaces of the photodiode and npn transistor regions. A p$^+$-type diffusion layer 37 is formed at the boundaries between respective elements to reach the p-type buried diffusion layer 33. A p$^+$-type diffusion layer 37a is formed in part of the n$^-$-type epitaxial layer 34. In the photodiode region, n$^+$-type diffusion layers 38a for a cathode are formed in the n-type epitaxial layer 36 and the n$^-$-type epitaxial layer 34 to reach the n$^+$-type buried diffusion layer 32. In the npn transistor region, an n$^+$-type diffusion layer 38b for a collector is formed deep in the n-type epitaxial layer 36 to reach the n$^+$-type buried diffusion layer 35, and a p$^+$-type diffusion layer 39 for a base is formed in part of the n-type epitaxial layer 36. An n$^+$-type diffusion layer 40 for an emitter is formed in part of the p$^+$-type diffusion layer 39.

In the circuit built-in light-receiving element having this arrangement, since the n$^-$-type epitaxial layer 34 is formed thick at a low concentration, the depletion layer can be widened to be longer than the light absorption length, and the adverse influence of the diffusion current can be reduced.

As described above, in the conventional circuit built-in light-receiving element shown in FIG. 8, uniform frequency characteristics cannot be obtained due to the influence of the diffusion current even in the region wherein the frequency is equal to or lower than the cutoff frequency of the circuit. In response to a beam incident on an adjacent light-receiving element, the light-receiving current flows to cause crosstalk between light-receiving elements. To decrease the diffusion current in this circuit built-in light-receiving element, it can be considered that the concentration above the p$^-$-type substrate 21 is set low to facilitate widening of the depletion layer, or that a general circuit process is also employed. However, the general circuit process cannot be actually employed because the whole circuit process must be improved in order to change the substrate concentration and the thickness of the epitaxial layer.

In the conventional circuit built-in light-receiving element shown in FIG. 11, the diffusion current can be decreased. However, since the n$^-$-type high-resistivity epitaxial layer 34 must be newly added to the conventional circuit process, the whole process must be improved, and the steps become complicated.

SUMMARY OF THE INVENTION

It is an object of the present invention to provide a circuit built-in light-receiving element capable of obtaining uniform frequency characteristics over a wide frequency band without changing the conventional circuit process.

It is another object of the present invention to provide a circuit built-in light-receiving element capable of reducing crosstalk between a plurality of light-receiving elements without changing the conventional circuit process.

In order to achieve the above objects, according to the present invention, there is provided a circuit built-in light-receiving element comprising a buried diffusion layer of a second conductivity type formed in a first region on a substrate of a first conductivity type, a buried diffusion layer of the first conductivity type selectively formed in the buried diffusion layer of the second conductivity type, an epitaxial layer of the second conductivity type formed on the buried diffusion layer of the first conductivity type, the buried diffusion layer of the first conductivity type and the epitaxial layer of the second conductivity type constituting a light-receiving element, a diffusion layer of the first conductivity type which reaches the buried diffusion layer of the first conductivity type through the epitaxial layer of the second conductivity type, and a signal processing circuit element formed in a second region on the substrate of the first conductivity type.

BRIEF DESCRIPTION OF THE DRAWINGS

FIG. 2 is a graph showing the frequency characteristics of the circuit built-in light-receiving element in FIG. 1;

FIG. 4 is a graph showing the photosensitivity map of the circuit built-in light-receiving element in FIG. 3;

DESCRIPTION OF THE PREFERRED EMBODIMENTS

The present invention will be described below with reference to the accompanying drawings.

Figure 1:
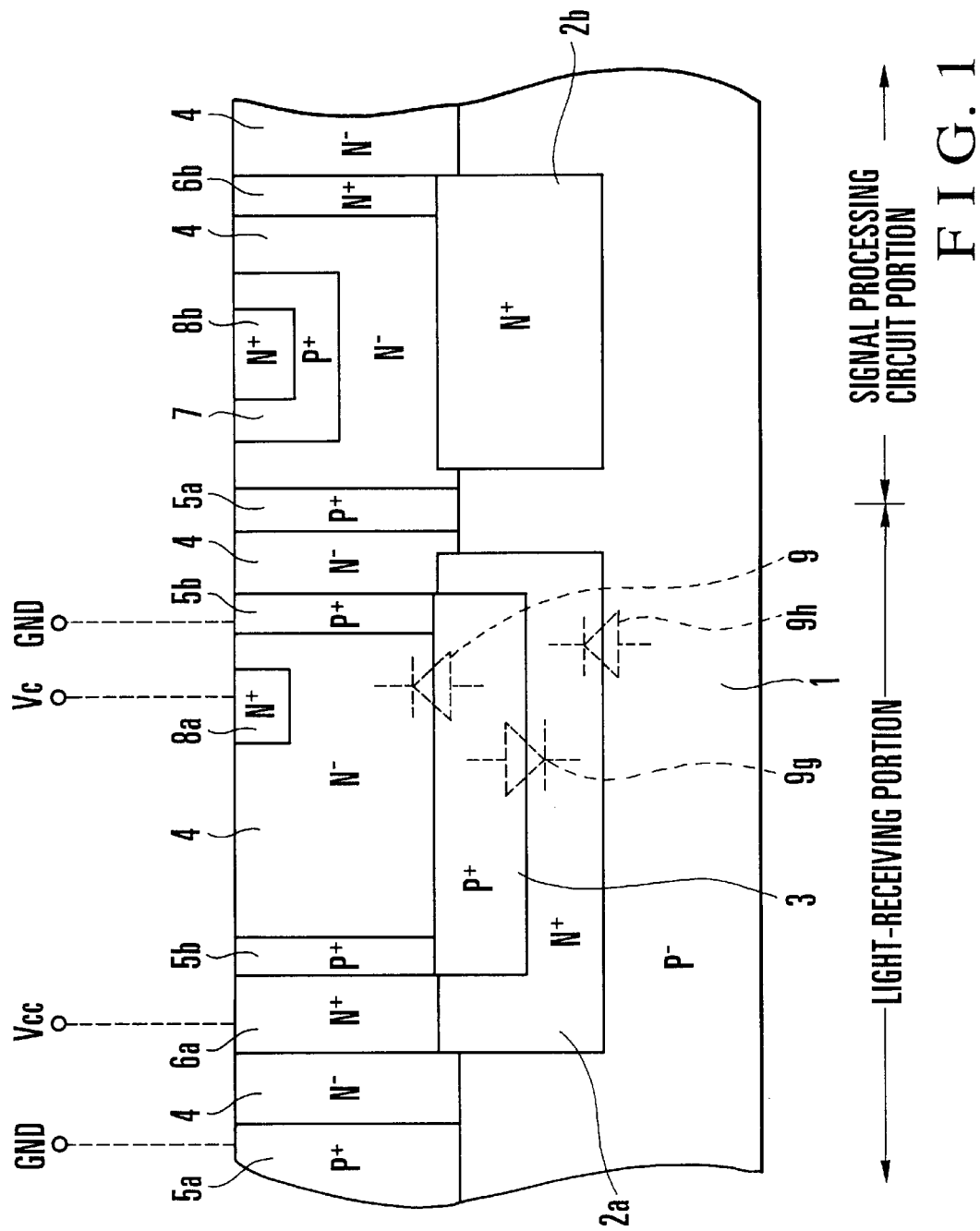
FIG. 1 is a sectional view of a circuit built-in light-receiving element according to the first embodiment of the present invention.
Figure 7:
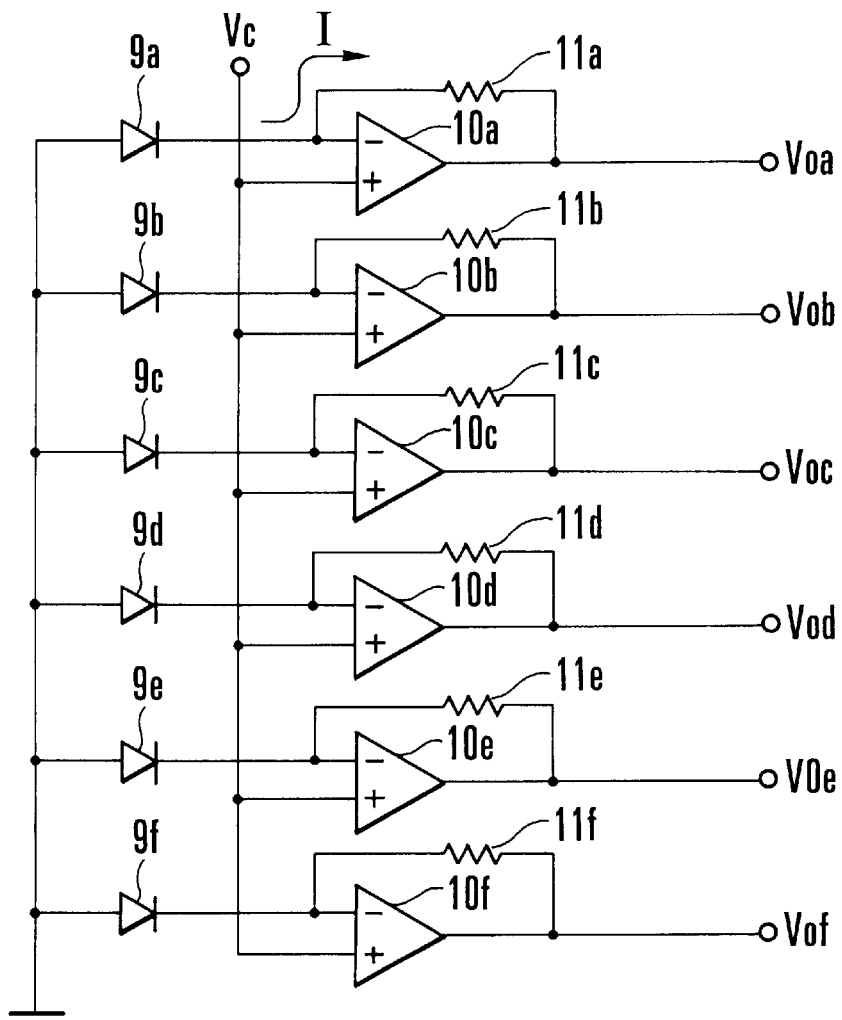
FIG. 7 is a circuit diagram of the photodetector shown in FIG. 5.
Figure 8:
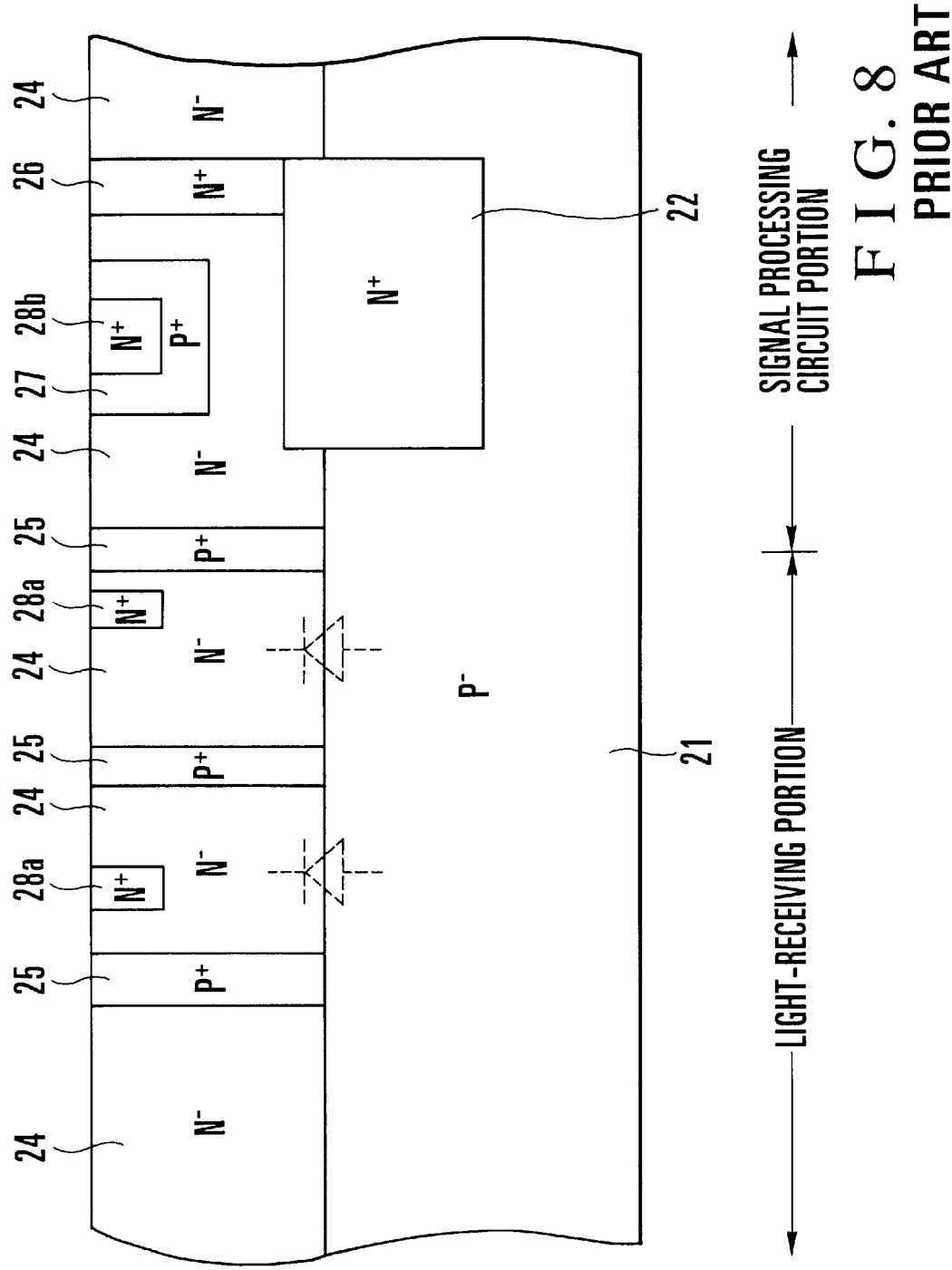
FIG. 8 is a sectional view of a conventional circuit built-in light-receiving element.
Figure 9:
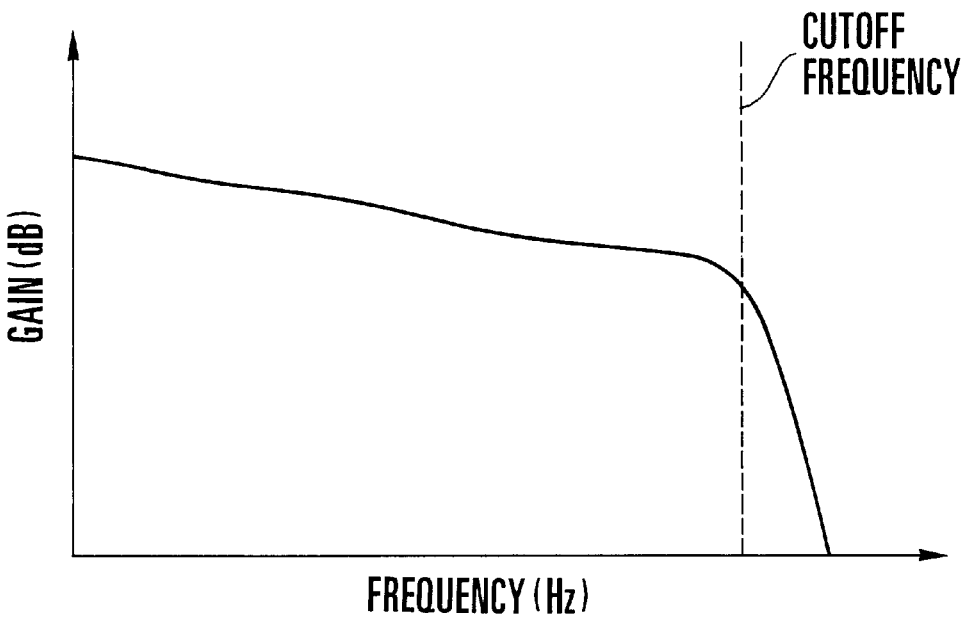
FIG. 9 is a graph showing the frequency characteristics of the circuit built-in light-receiving element in FIG. 8.
Figure 10:
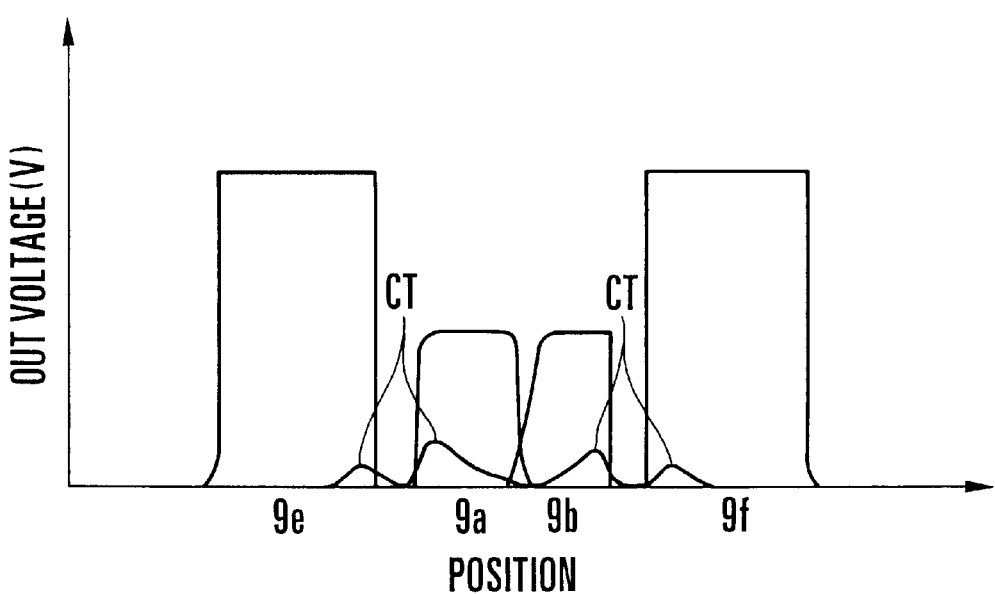
FIG. 10 is a graph showing the photosensitivity map of the circuit built-in light-receiving element in FIG. 8.
Figure 11:
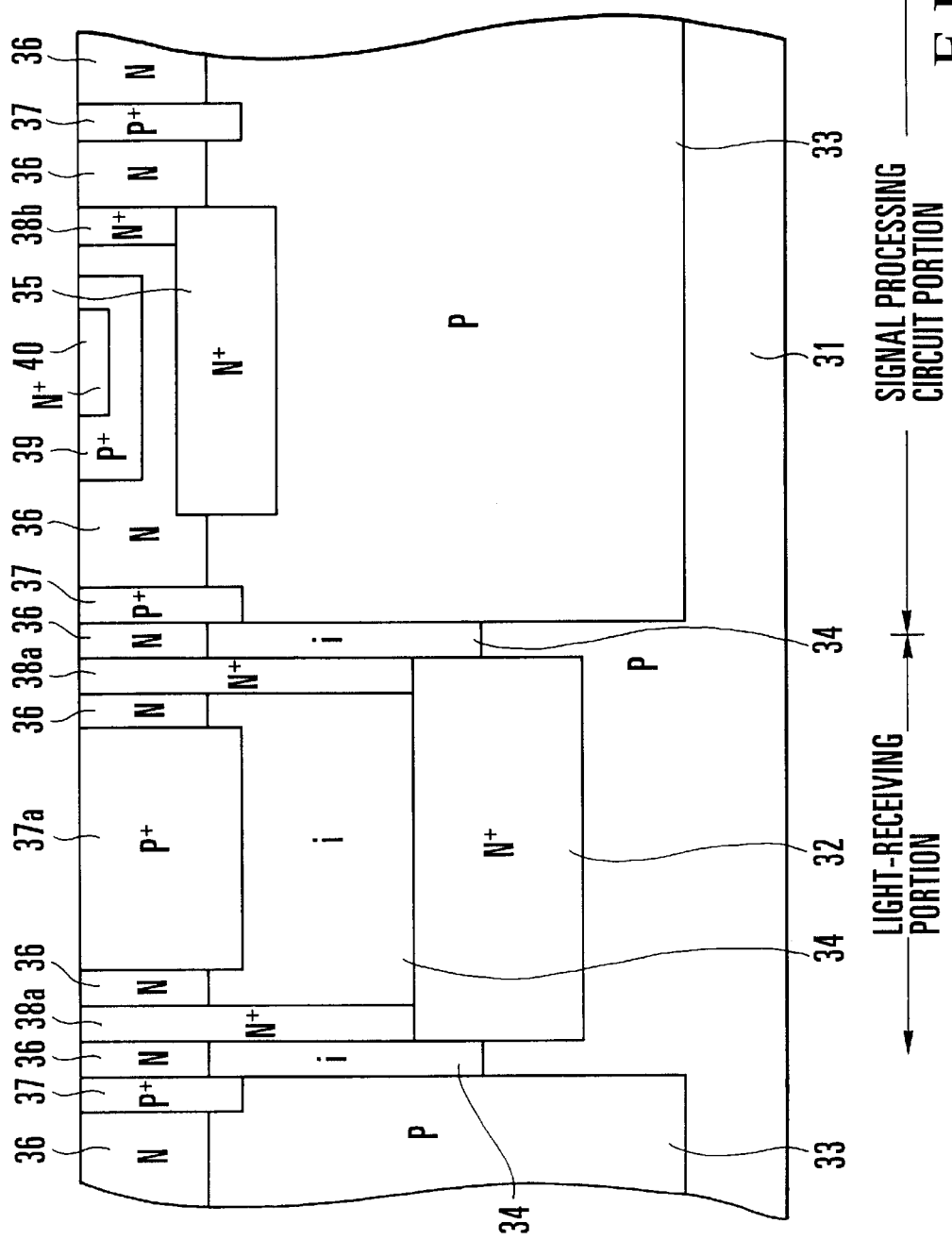
FIG. 11 is a sectional view of another conventional circuit built-in light-receiving element.

FIG. 1 shows a circuit built-in light-receiving element according to the first embodiment of the present invention. In FIG. 1, a photodiode 9 serving as a photodiode, and an npn transistor serving as part of a signal processing circuit portion (current-voltage conversion amplifiers 10a to 10f in FIG. 7) are formed on a p$^-$-type substrate 1. Note that the photodiodes 9 and current-voltage conversion amplifiers 10a to 10f are connected as shown in FIG. 7.

The arrangement of the circuit built-in light-receiving element shown in FIG. 1 will be described below together with its manufacturing method. An n$^+$-type buried diffusion layer 2a is selectively formed in a prospective photodiode region on the p$^-$-type substrate 1. At the same time, an n$^+$-type buried diffusion layer 2b is selectively formed in the prospective region of an npn transistor constituting a signal processing circuit on the p⁻-type substrate 1. A p⁺-type buried diffusion layer 3 is formed in part of the n⁺-type buried diffusion layer 2a.

An n⁻-type epitaxial layer 4 is formed on the entire surface of the p⁻-type substrate 1 including the n⁺-type buried diffusion layers 2a and 2b and the p⁺-type buried diffusion layer 3. A p⁺-type diffusion layer 5a for separating respective elements is formed at the boundaries between the respective elements to reach the p⁻-type substrate 1 through the epitaxial layer 4. At the same time, p⁺-type diffusion layers 5b for the anode of the photodiode 9 are formed to reach the p⁺-type buried diffusion layer 3 through the epitaxial layer 4.

An n⁺-type diffusion layer 6a for the cathode of a dummy photodiode (to be described later) is formed to reach the n⁺-type buried diffusion layer 2a through the epitaxial layer 4. At the same time, an n⁺-type diffusion layer 6b for the collector of the npn transistor is formed to reach the n⁺-type buried diffusion layer 2b through the epitaxial layer 4.

In the region of the signal processing circuit portion, a p⁺-type diffusion layer 7 serving as the base of the npn transistor is formed in part of the n⁻-type epitaxial layer 4. An n⁺-type diffusion layer 8b serving as the emitter of the npn transistor is formed in part of the p⁺-type diffusion layer 7. At the same time, in the region of the light-receiving portion, an n⁺-type diffusion layer 8a for the cathode of the photodiode 9 is formed in part of the n⁻-type epitaxial layer 4.

Finally, an insulating film (not shown) is formed on the entire surface, holes are formed at necessary portions in the insulating film, and a metal layer (not shown) constituting an electrode and an interconnection is formed. In this manner, the circuit built-in light-receiving element having the arrangement in FIG. 1 can be obtained.

The potential Vcc is applied via the n⁺-type diffusion layer 6a to the n⁺-type buried diffusion layer 2a serving as the cathodes of dummy photodiodes 9g and 9h which do not contribute to detection of an optical signal. The GND (ground) potential is applied via the p⁺-type diffusion layer 5b to the p⁺-type buried diffusion layer 3 serving as the anode of the photodiode 9. The GND potential is applied via the p⁺-type diffusion layer 5a to the p⁻-type substrate 1 serving as the anode of the dummy photodiode 9h.

Since the n⁺-type diffusion layer 8a serving as the cathode of the photodiode 9 is connected to the inverting terminal of the current-voltage conversion amplifier arranged at the signal processing circuit portion, as in FIG. 7, the n⁻-type epitaxial layer 4 has the reference potential Vc. Note that the relationship between the respective potentials is Vcc>Vc>GND.

At the light-receiving portion having this arrangement, a beam incident downward on the chip reaches the p⁻-type substrate 1 through the n⁻-type epitaxial layer 4. A photocurrent generated in response to the beam in a depletion layer at the p-n junction of the photodiode 9 constituted by the p⁺-type buried diffusion layer 3 and the n⁻-type epitaxial layer 4 flows into the inverting terminal of the current-voltage conversion amplifier.

Carriers generated at a portion deeper than the depletion layer flow into GND and Vcc through the p⁺-type buried diffusion layer 3 and the n⁺-type buried diffusion layer 2a which constitute the dummy photodiode 9g, and the n⁺-type buried diffusion layer 2a and the p⁻-type substrate 1 which constitute the dummy photodiode 9h.

That is, of electrons generated in the p⁺-type buried diffusion layer 3, components which diffuse to the dummy photodiode 9g, and of electrons generated in the p⁻-type substrate 1, components which diffuse to the dummy photodiode 9h reach the n⁺-type buried diffusion layer 2a, and flow into Vcc through the n⁺-type diffusion layer 6a.

Holes generated in the n⁺-type buried diffusion layer 2a diffuse to the dummy photodiode 9g or 9h, reach the p⁺-type buried diffusion layer 3 or the p⁻-type substrate 1, and flow into GND.

Carriers which are generated at a portion deeper than the depletion layer of the photodiode 9 and spread by diffusion are changed into a photocurrent by the dummy photodiodes 9g and 9h before they reach the photodiode 9. For this reason, only carriers generated near the surface contribute to the photocurrent flowing into the current-voltage conversion amplifier, so that high-speed response can be achieved.

The n⁺-type buried diffusion layer 2a can be formed at the same time as formation of the npn transistor, and the p⁺-type buried diffusion layer 3 can be formed at the same time as formation of the pnp transistor. The circuit built-in light-receiving element can be formed by the conventional circuit process without changing any process.

FIG. 2 shows the frequency characteristics of the circuit built-in light-receiving element in FIG. 1. The frequency characteristics show the gain of the output voltage (output from the current-voltage conversion amplifier) for the frequency of an input beam. Because of no influence of the diffusion current, uniform characteristics can be obtained until the cutoff frequency of the circuit.

Figure 3:
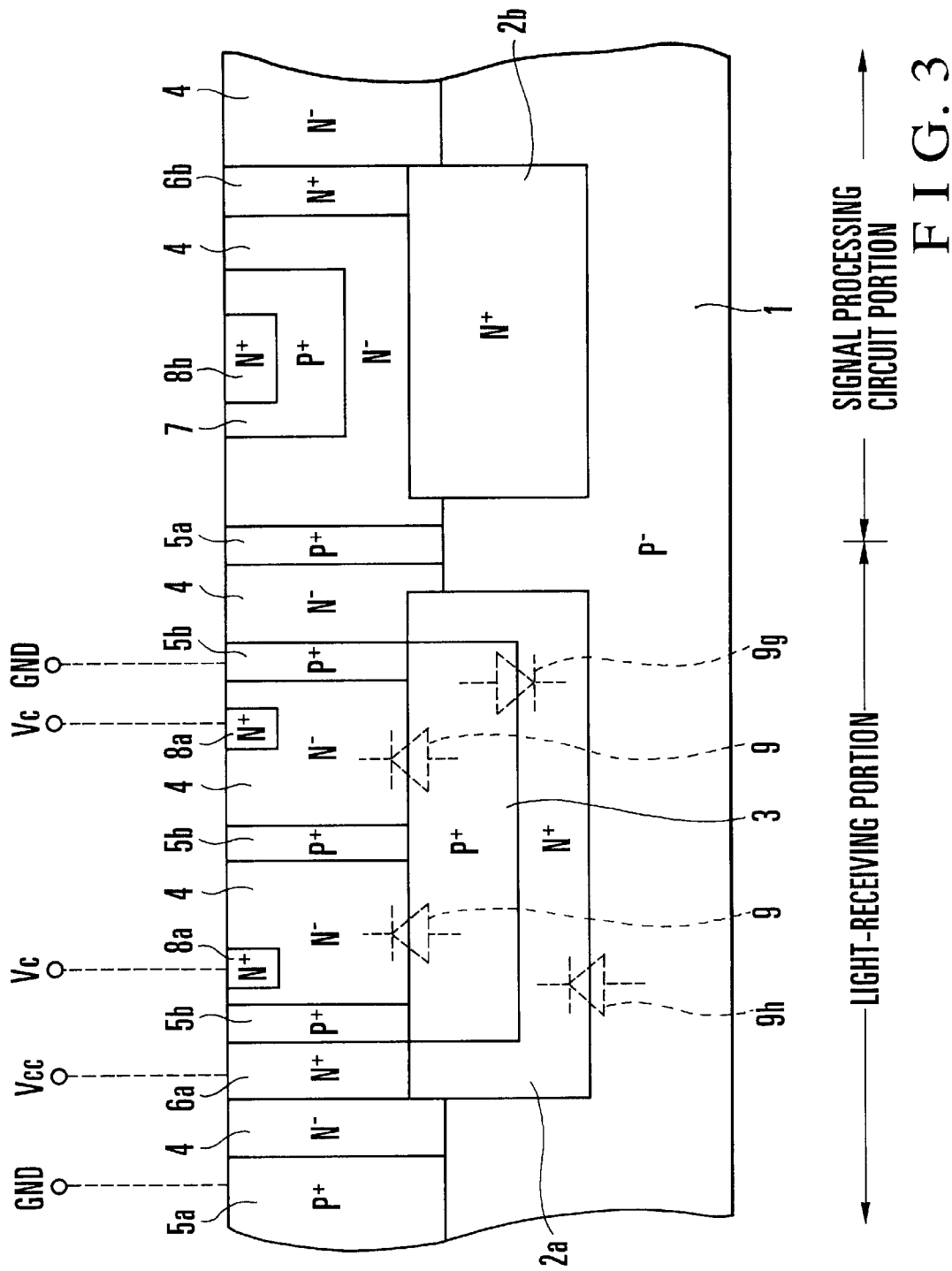
FIG. 3 is a sectional view showing a circuit built-in light-receiving element according to the second embodiment of the present invention.
Figure 5:
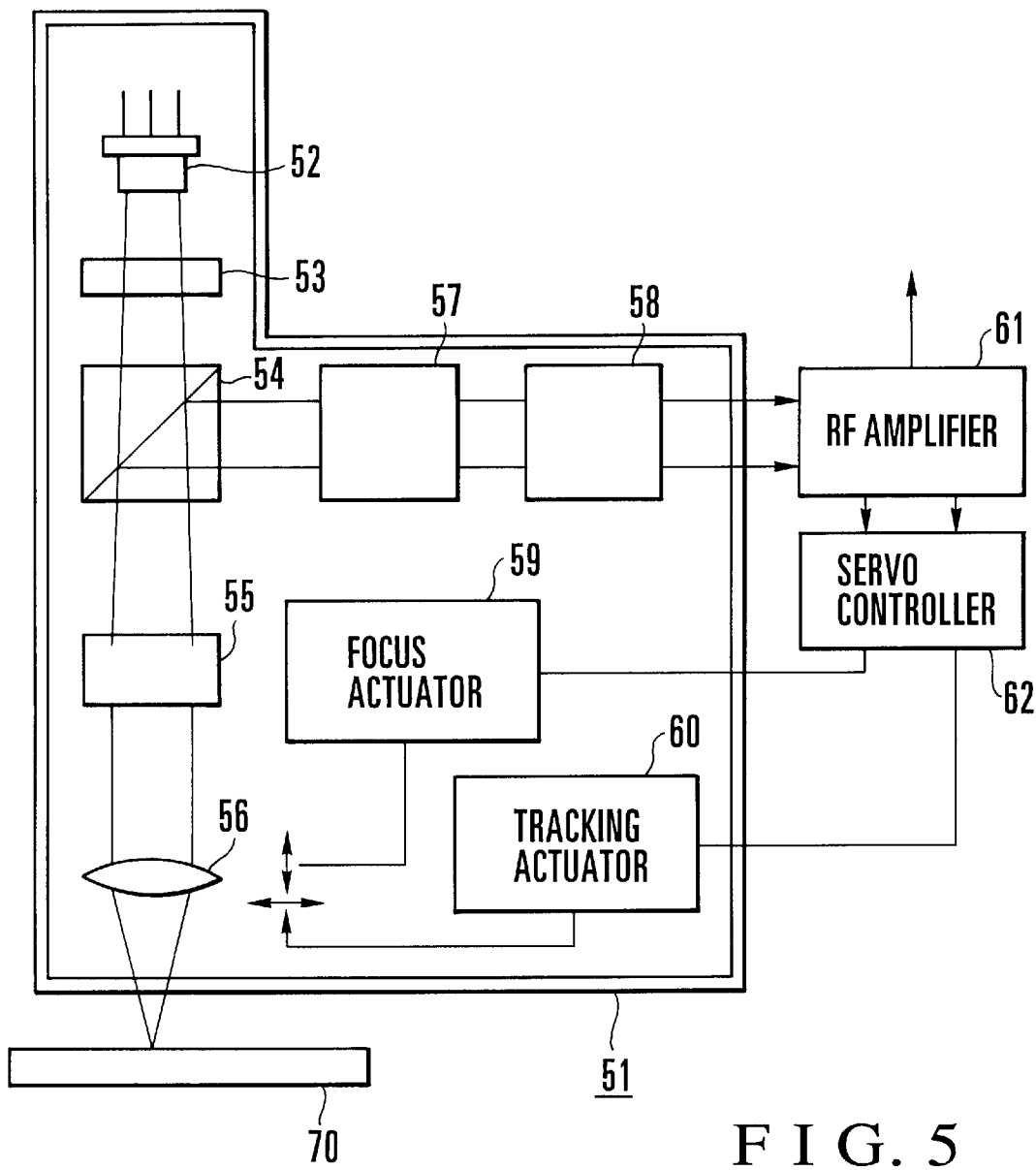
FIG. 5 is a block diagram showing the basic arrangement of an optical disk apparatus using a circuit built-in light-receiving element.

FIG. 3 shows a circuit built-in light-receiving element according to the second embodiment of the present invention. The same reference numerals as in FIG. 1 denote the same parts, and a description thereof will be omitted. In the second embodiment, two photodiodes 9 are formed. In the region of a light-receiving portion, the two photodiodes 9 are separated by a p⁺-type diffusion layer 5b which reaches a p⁺-type buried diffusion layer 3 through the center of an epitaxial layer 4.

No crosstalk occurs because the diffusion current flows into Vcc and GND, as in the first embodiment. Also in the second embodiment, the circuit built-in light-receiving element can be formed by only the conventional circuit process without changing any process.

Figure 6:
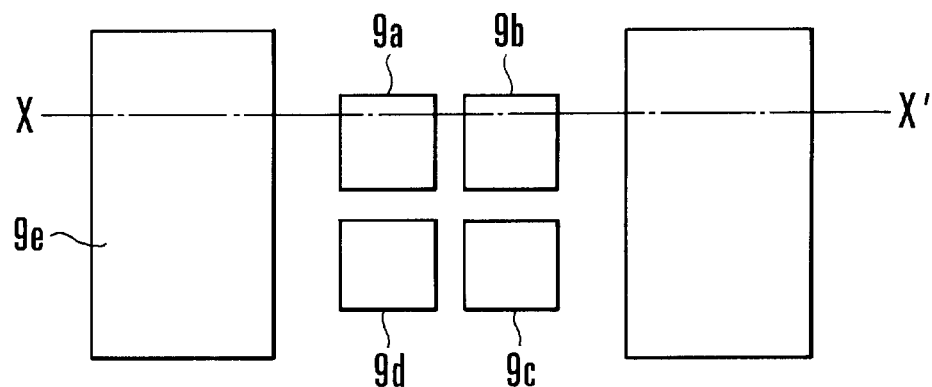
FIG. 6 is a plan view showing the arrangement of the light-receiving portion of the photodetector shown in FIG. 5.

FIG. 4 shows the value of the output voltage (output from the current-voltage conversion amplifier connected to each photodiode) when a beam is scanned along the line X–X' in a circuit built-in light-receiving element obtained by two-dimensionally arranging a plurality of photodiodes, as in FIG. 6, by using the structure of the second embodiment. As is apparent from FIG. 4, according to the second embodiment, ideal characteristics can be obtained without any crosstalk between light-receiving elements.

According to the present invention, a light-receiving element is constituted by a buried diffusion layer of the first conductivity type and an epitaxial layer of the second conductivity type, and dummy light-receiving elements are respectively constituted by a buried diffusion layer of the first conductivity type and a buried diffusion layer of the second conductivity type, and the buried diffusion layer of the second conductivity type and a substrate of the first conductivity type. With this arrangement, a diffusion current generated at a portion deeper than the depletion layer of the light-receiving element reaches the dummy light-receiving element before it reaches the light-receiving element. Therefore, no diffusion current flows into the input of a current-voltage conversion amplifier connected to the light-receiving element. A high-response-speed circuit built-in light-receiving element in which uniform frequency characteristics can be attained over a wide frequency band, and no crosstalk occurs between a plurality of light-receiving elements can be realized. In addition, since the buried diffusion layers of the first and second conductivity types are also used in the conventional circuit process, the process need not be changed.

What is claimed is:

1. A circuit built-in light-receiving element comprising:

a buried diffusion layer of a second conductivity type formed in a first region on a substrate of a first conductivity type;

a buried diffusion layer of the first conductivity type selectively formed in said buried diffusion layer of the second conductivity type;

an epitaxial layer of the second conductivity type formed on said buried diffusion layer of the first conductivity type, said buried diffusion layer of the first conductivity type and said epitaxial layer of the second conductivity type constituting a light-receiving element;

a diffusion layer of the first conductivity type which reaches said buried diffusion layer of the first conductivity type through said epitaxial layer of the second conductivity type; and a signal processing circuit element formed in a second region on said substrate of the first conductivity type.

2. An element according to claim 1, wherein a first potential as a highest potential is applied to said buried diffusion layer of the second conductivity type, a second lowest potential is applied to said buried diffusion layer of the first conductivity type via said diffusion layer of the first conductivity type, and a third potential between the first and second potentials is applied to said epitaxial layer of the second conductivity type.

3. An element according to claim 2, further comprising a diffusion layer of the second conductivity type which reaches said buried diffusion layer of the second conductivity type through said epitaxial layer of the second conductivity type, and wherein the first potential is applied to said buried diffusion layer of the second conductivity type via said diffusion layer of the second conductivity type.

4. An element according to claim 1, wherein said epitaxial layer of the second conductivity type is divided by a plurality of diffusion layers of the first conductivity type which reach said buried diffusion layer of the first conductivity type, and said buried diffusion layer of the first conductivity type and said divided epitaxial layers of the second conductivity type constitute a plurality of light-receiving elements.

5. An element according to claim 1, wherein said buried diffusion layer of the first conductivity type and said buried diffusion layer of the second conductivity type constitute a first dummy light-receiving element, and said substrate of the first conductivity type and said buried diffusion layer of the second conductivity type constitute a second dummy light-receiving element.

6. An element according to claim 1, wherein said signal processing circuit element is an npn transistor constituted by a base diffusion layer of the first conductivity type, an emitter diffusion layer of the second conductivity type, and a collector diffusion layer of the second conductivity type.

7. An element according to claim 1, further comprising a separation diffusion layer of the first conductivity type formed deep at a boundary between the first and second regions to reach said substrate of the first conductivity type through said epitaxial layer of the second conductivity type, thereby separating said light-receiving element from said signal processing circuit element.

8. A circuit built-in light-receiving element comprising:

a buried diffusion layer of a second conductivity type formed in a first region on a substrate of a first conductivity type;

a buried diffusion layer of the first conductivity type selective formed in said buried diffusion layer of the second conductivity type;

an epitaxial layer of the second conductivity type formed on said buried diffusion layer of the first conductivity type, said buried diffusion layer of the first conductivity type and said epitaxial layer of the second conductivity type constituting an light-receiving element;

a diffusion layer of the first conductivity type which reaches said buried diffusion layer of the first conductivity type through said epitaxial layer of the second conductivity type; and a signal processing circuit element formed in a second region on said substrate of the first conductivity type, said light-receiving element outputting an optical signal to said signal processing circuit, wherein said buried diffusion layer of the first conductivity type and said buried layer of the second conductivity type form a first dummy light-receiving element, said first dummy light-receiving element and said diffusion layer of the first conductivity type forming a first pathway through which a diffusion current, generated at a portion deeper than a depletion layer of said light-receiving element, passes to a first electrode connected to said diffusion layer.

9. An element according to claim 8, wherein said substrate of the first conductivity type and said buried diffusion layer of the second conductivity type constitute a second dummy light-receiving element, said second dummy light-receiving element forming a second pathway for passing said diffusion current into a second electrode.

10. A circuit built-in light-receiving element comprising:

a buried diffusion layer of a second conductivity type formed in a first region on a substrate of a first conductivity type;

a buried diffusion layer of the first conductivity type selective formed in said buried diffusion layer of the second conductivity type;

an epitaxial layer of the second conductivity type formed on said buried diffusion layer of the first conductivity type;

a first diffusion layer of the first conductivity type for dividing said epitaxial layer into first and second epitaxial layers, said buried diffusion layer of the first conductivity type and said first and second epitaxial layers of the second conductivity type respectively forming two light-receiving elements;

a second diffusion layer of the first conductivity type which reaches said buried diffusion layer of the first conductivity type through one of said first and second epitaxial layers of the second conductivity type; and a signal processing circuit element formed in a second region on said substrate of the first conductivity type, said two light-receiving elements outputting optical signals to said signal processing circuit.

11. An element according to claim 10, wherein said two light-receiving elements output optical signals to said signal processing circuit, and wherein said buried diffusion layer of the first conductivity type and said buried layer of the second conductivity type form a first dummy light-receiving element, said first dummy light-receiving element and said diffusion layer of the first conductivity type forming a pathway through which a diffusion current, generated at a portion deeper than a depletion layer of said light-receiving element, passes to a first electrode connected to one of said first and second diffusion layers.

12. An element according to claim 11, further comprising:

a diffusion layer of the second conductivity type which reaches said buried diffusion layer of the second conductivity type through one of said first and second epitaxial layers of the second conductivity type, wherein said substrate of the first conductivity type and said buried diffusion layer of the second conductivity type constitute a second dummy light-receiving element, said second dummy light-receiving element and said diffusion layer of the second conductivity type forming a second pathway for passing said diffusion current into a second electrode connected to said diffusion layer of the second conductivity type.

13. An element as recited in claim 12, wherein a first potential is applied to said first electrode and a second potential is applied to said second electrode, said first potential being lower than said second potential.

14. An element as recited in claim 13, wherein a third potential is connected to said first and second epitaxial layers, said third potential being between said first potential and said second potential.

* * * * *